United States Patent
Kim

(10) Patent No.: US 7,246,302 B2
(45) Date of Patent: Jul. 17, 2007

(54) DISK PLAYER FOR ALLOCATING POINTERS TO FRAMES OF CD DATA AND STORING POINTERS IN MEMORY AND METHOD OF PROCESSING REPRODUCED DATA OF DISK PLAYER

(75) Inventor: Young-Goan Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 423 days.

(21) Appl. No.: 10/949,670

(22) Filed: Sep. 25, 2004

(65) Prior Publication Data

US 2005/0102604 A1 May 12, 2005

(30) Foreign Application Priority Data

Nov. 11, 2003 (KR) .................. 10-2003-0079591

(51) Int. Cl.
*G11B 20/18* (2006.01)
*G11B 20/24* (2006.01)
(52) U.S. Cl. .......................... 714/769; 710/52
(58) Field of Classification Search ............... 714/769; 710/52

See application file for complete search history.

(56) References Cited

U.S. PATENT DOCUMENTS

| | | | |
|---|---|---|---|
| 4,860,272 A * | 8/1989 | Nishikawa et al. ....... | 369/53.28 |
| 4,932,018 A * | 6/1990 | Nagasawa et al. ....... | 369/59.25 |
| 5,453,964 A * | 9/1995 | Shimizume .............. | 369/47.32 |
| 5,655,052 A * | 8/1997 | Nakai et al. ............. | 386/106 |
| 6,185,640 B1 * | 2/2001 | Ross ........................ | 710/53 |
| 6,226,236 B1 * | 5/2001 | Yamamoto et al. ...... | 369/59.23 |
| 6,246,650 B1 * | 6/2001 | Kuroiwa .................. | 369/47.38 |

FOREIGN PATENT DOCUMENTS

| | | |
|---|---|---|
| JP | 2001291276 | 10/2001 |
| KR | 100273490 | 12/2000 |
| KR | 100284447 | 2/2001 |

OTHER PUBLICATIONS

English Abstract.
English Abstract.
English Abstract.

* cited by examiner

Primary Examiner—Stephen M. Baker
(74) Attorney, Agent, or Firm—F. Chau & Associates, LLC

(57) ABSTRACT

Disk players for allocating pointers to the respective frames of CD data and storing the pointers in a memory, and methods of processing reproduced data of the disk player are provided. According to one aspect, a disk player includes a pointer controller, which allocates pointers to frames of recorded data read from a disk, wherein the allocation of the pointers starts from a first frame following frames having special sub-code synchronization signals and is performed in a predetermined order; a memory, which stores the frames and the allocated pointers; and a memory controller, which controls an operation of writing the data to memory. A pointer is allocated to every frame of the recorded data reproduced from the disk player, and the allocated pointers and the frame data are stored in the memory. The pointers are retrieved and the respective frame data stored in the memory are output. Therefore, the sound continuity can be maintained even in a vibration environment causing jitter.

16 Claims, 4 Drawing Sheets

< Prior Art >

DISK PLAYER FOR ALLOCATING POINTERS TO FRAMES OF CD DATA AND STORING POINTERS IN MEMORY AND METHOD OF PROCESSING REPRODUCED DATA OF DISK PLAYER

CROSS-REFERENCE TO RELATED APPLICATION

This application claims priority to Korean Patent Application No. 2003-79591, filed on Nov. 11, 2003, the disclosure of which is incorporated herein by reference in its entirety.

BACKGROUND

1. Field of the Invention

The present invention relates, generally, to a disk player, and more particularly, to a disk player for allocating pointers to respective frames of CD data and storing the pointers in a memory to reproduce the CD data even in a jitter environment, and methods of processing reproduced data of the disk player.

2. Description of the Related Art

In a Compact disk (CD) player, when so-called "track jumping" occurs due to an external impact causing vibration during the disk reproduction, it is important to prevent "sound discontinuity" by ensuring continuity of PCM data. Track jumping means that a light spot of a pickup unit, which reads recorded information by tracing tracks on the disk, deviates from the tracks.

FIG. 1 is a schematic of a conventional CD player. Referring to FIG. 1, a disk 1 is driven by a spindle motor 2. The recorded information of the disk 1 is read by an optical pickup unit 3. The optical pickup unit 3 comprises an object lens 5 for focusing a laser beam as an information-read-out light spot on a signal plane of the disk 1, a polarizing beam splitter 6 for changing a direction of a reflected light beam from the disk 1, and a photo detector 7 for receiving the reflected light beam. The optical pickup unit 3 is arranged to move in a radial direction. An output current signal of the optical pickup unit 3 is converted to a voltage signal by an I/V amplifier 8. The voltage signal is subjected to a waveform-shaping process in an RF equalizer circuit 9, and then, the signal is processed by a DSP circuit 10.

The DSP circuit 10 comprises a PLL asymmetry correction circuit 11, an EFM (eight-to-fourteen modulation) demodulation circuit 12, a sub-code processing circuit 13, a RAM 14, an error correction circuit 15, a de-interleave circuit 16, a spindle servo processing unit 18, and a clock signal generator 17. The PLL asymmetry correction circuit 11 corrects a deviation of the RF signal center from the amplitude center. The EFM signal demodulation circuit 12 demodulates an EFM signal, the sub-code synchronization signal SCOR, and a sub-code signal. The demodulated sub-code signal is sent through the sub-code processing circuit 13 to a microcomputer 20, which has overall control over the system. After the EFM demodulation, the PCM data is temporarily stored in the RAM 14. The error correction circuit 15 performs an error correction based on the error correction/detection parity of the PCM data. The interleave of a CIRC (cross interleave Reed-Solomon code) is released by the de-interleave circuit 16. The clock signal generator 17 generates a system clock signal based on an oscillation output of a quartz oscillator 21, so that the DSP circuit 10 can process signals based on the system clock signal.

In the RAM 14, a reproducing clock signal, which is generated by the PLL asymmetry correction circuit 11, is used as a write-in clock signal WFCK and the system clock signal is used as a read-out clock signal RFCK. The PCM data, which is processed by the DSP circuit 10, is stored in a large capacity DRAM 23 through an ESP (electric shock proof) controller 22. The PCM data, which is stored in the DRAM 23, is read by the ESP controller 22, subjected to a filtering process in a digital filter 24 and an analog process in a D/A (digital-to-analog) converter 25, and then, output as an audio signal through left and right channels.

The DRAM 23 is used to ensure continuity of PCM data to prevent the sound discontinuity when track jumping occurs due to an external impact causing vibration during the disk reproduction. When track jumping occurs, the information-read-out light spot of the optical pickup unit 3 is returned to the point just before the occurrence of track jumping and reproduction is carried out at this point, under the control of the microcomputer 20. In addition, the PCM data stored in the DRAM 23 just before the occurrence of track jumping is linked to the PCM data obtained after reproduction under the control of the ESP controller 22.

Since the sound continuity process is carried out in units of a sub-code frame, wow, which is a variation in the pitch of the music caused by, e.g., some mechanical flaw, of the spindle motor 2 is removed in the reproducing sub-code synchronization signal SCOR to maintain the sound continuity in the time axis. The ESP controller 22 further comprises a sub-code synchronization signal generation circuit for generating a sub-code synchronization signal SCOR in which the wow of the spindle motor 22 is removed, as shown in FIG. 2.

FIG. 2 is a diagram illustrating a sub-code synchronization signal generation circuit of the conventional CD player of FIG. 1. Referring to FIG. 2, a jitter counter 28 measures the value of jitter of the write-in clock signal WFCK with reference to the read-out clock signal RFCK. The write-in clock signal WFCK is a reproduced clock signal from the disk 1 and the read-out clock signal is a fixed clock signal. An inner circumference counter 29 is provided to count 98 frames of the write-in clock signal WFCK. In an addition/subtraction unit 30, the output of the inner circumference counter 29 is added to, or subtracted from, the value of jitter measured by the jitter counter 28.

The value of jitter is subtracted from the counter output corresponding to the 98 frames of the write-in clock signal WFCK, and the reproducing sub-code synchronization signal SCOR having the wow of the spindle motor is corrected in the time axis, so that the wow in the reproducing sub-code synchronization signal SCOR can be removed and a sub-code synchronization signal GRSCOR in synchronization with the PCM data read from the DRAM 23 can be generated based on the read-out clock signal RFCK with a higher accuracy.

A match detection circuit 33 is provided to detect a match between the reproducing sub-code synchronization signal SCOR and the counter output of the inner circumference counter 29. For example, when there are two consecutive matches, a match detection signal GSS may be output. When the match detection signal GSS is sent, that is, when the reproducing sub-code synchronization signal SCOR and the counter output of the inner circumference counter 29 are consecutively matched two times, the reproducing sub-code synchronization signal GRSCOR is generated and output. As a result, an erroneous reproducing sub-code synchronization signal generated due to a scratch on the disk can be excluded and the reproducing sub-code synchronization signal GRSCOR of the optical disk player can be identified.

In the aforementioned optical disk player, the sub-code data obtained from the disk is temporarily stored in the memory, and then, the data read from the memory is finally selected by using the reproducing sub-code synchronization signal, so that the data can be reproduced by ensuring the data continuity without the sound discontinuity. Although the data is stable in a jitter environment causing vibration, a disadvantage of the conventional optical disk player is that the conventional optical disk player has a complex hardware construction.

Therefore, a need exists for a CD player with a minimum amount of hardware construction which is capable of reproducing data without sound discontinuity even in a jitter environment.

SUMMARY OF THE INVENTION

Exemplary embodiments of the present invention provide disk players for allocating pointers to respective frames of a CD data block and storing the pointers in a memory Exemplary embodiments of the present invention also provide methods of processing reproduced data of the aforementioned disk players.

According to an exemplary embodiment of the present invention, a disk player comprises a pointer controller, which allocates pointers to frames of recorded data read from a disk, wherein the allocation of the pointers starts from a first frame following frames having special sub-code synchronization signals and is performed in a predetermined order; a memory, which stores the frames and the allocated pointers; and a memory controller, which controls data access operations of the memory.

In one exemplary embodiment, the pointer controller comprises a counter, which allocates pointers to 98 frames in one data block sequentially and the pointer controller comprise a register, which stores the pointers. The memory may be an SRAM, which stores the allocated pointers and the frame data mapped to the allocated pointers.

According to another exemplary embodiment of the present invention, a disk player comprises a PLL asymmetry correction circuit, which receives recorded data of a disk, wherein the recorded data are RF signals which are waveform-shaped by an RE equalizer under control of a servo; an EFM signal demodulation circuit, which demodulates PCM data, a sub-code synchronization signal SCOR, and a sub-code data signal, which are outputs of the PLL asymmetry correction circuit; a microcomputer, which receives a demodulated sub-code data signal through a sub-code decoder, wherein the sub-code decoder decodes the modulated sub-code data signal; an error correction circuit, which corrects an error based on an error correction/detection parity of the PCM data; a pointer controller, which allocates pointers to frames, wherein the allocation of the pointers starts from a first frame following frames having special sub-code synchronization signals and is performed in a predetermined order; a memory, which stores the frames and the allocated pointers; a memory controller, which controls data access operations of the memory; and an interpolator, which converts digital signals stored in the memory to analog signals and outputs the analog signals through left and right channels. According to another exemplary embodiment of the present invention, a method of processing a reproduced data in a disk player comprises the steps of: reading recorded data on a disk, wherein the disk is rotated; detecting sub-code synchronization signals from frames of the read recorded data; allocating pointers to the frames, wherein the allocation of the pointers starts from a first frame following frames having special sub-code synchronization signals and is performed in a predetermined order; storing the frames and the allocated pointers; and reading the allocated pointers stored in the memory and updating a time. It is preferable that the step of allocating pointers to the frames is a step of allocating pointers to 98 frames in one data block sequentially.

According to another exemplary embodiment of the present invention, a method of processing a reproduced data in a disk player comprises the steps of receiving recorded data of a disk, wherein the recorded data are RF signals which are waveform-shaped by an RF equalizer under control of a servo; correcting deviation of the center of the RF signal from a center of amplitude of a vibration; demodulating PCM data, a sub-code synchronization signal and a sub-code data signal by demodulating the corrected RF signal; decoding the demodulated sub-code data signal and transmitting the decoded demodulated sub-code data signal to a microcomputer; correcting an error based on an error correction/detection parity of the PCM data; allocating pointers to frames, wherein the allocation of the pointers starts from a first frame following frames having special sub-code synchronization signals and is performed in a predetermined order; storing the frames and the allocated pointers; reading the allocated pointer stored in the memory and updating a time; and converting digital signals stored in the memory to analog signals and outputting the analog signals through left and right channels.

According to exemplary embodiments of the present invention, since a pointer is allocated to every frame of the recorded data reproduced from the disk player, the allocated pointers and the frame data are stored in the memory, the pointers are retrieved, and the respective frame data stored in the memory are output, so that the sound continuity can be maintained even in a jitter environment causing vibration. In addition, the complex hardware construction of a conventional CD player is unnecessary.

These and other exemplary embodiments, features, aspects, and advantages of the present invention will be described and become more apparent from the detailed description of exemplary embodiments when read in conjunction with accompanying drawings.

DETAILED DESCRIPTION OF EXEMPLARY EMBODIMENTS

Figure 1:
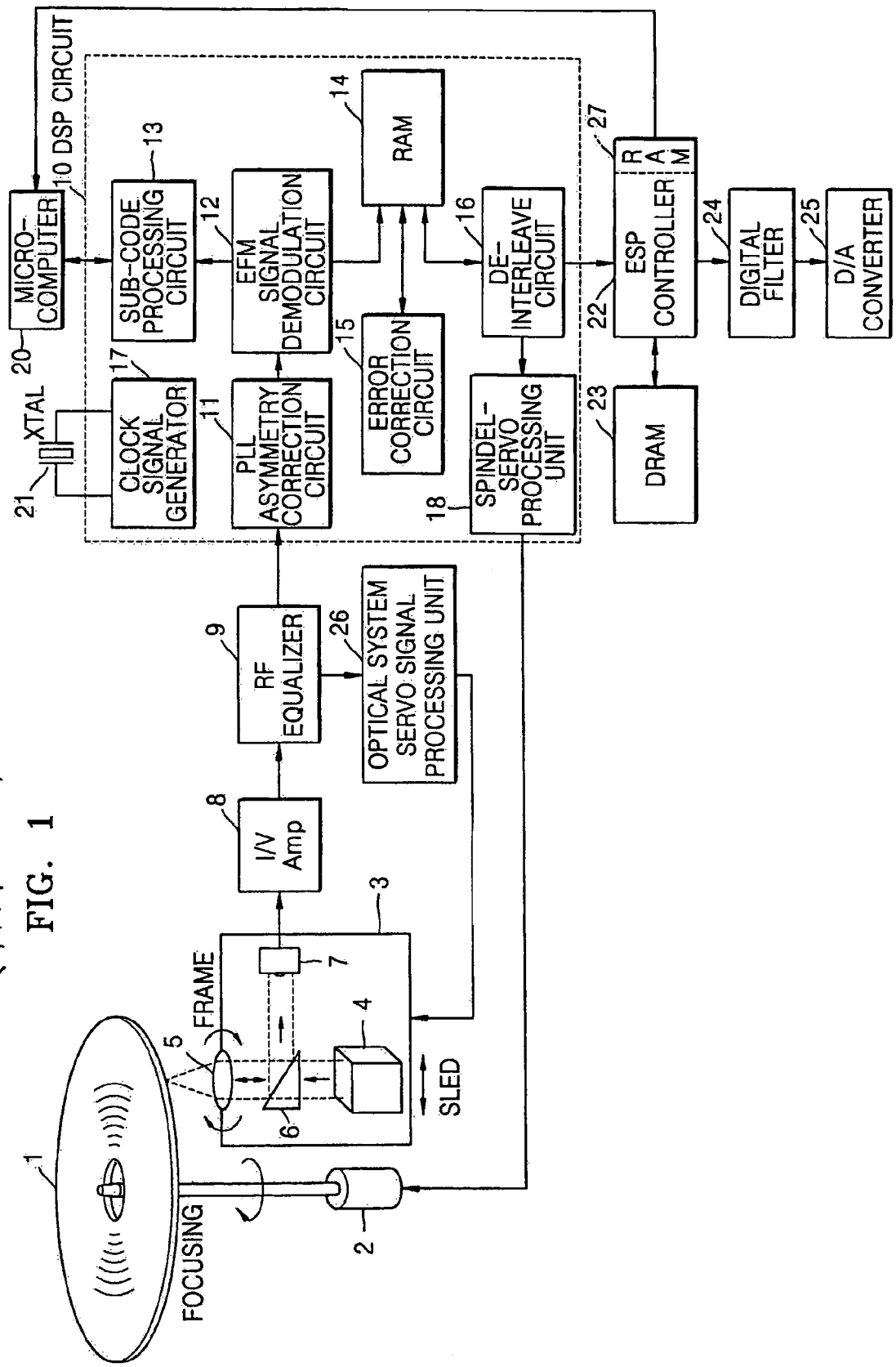
FIG. 1 is a schematic of a conventional CD player.

Exemplary embodiments of the present invention and operational advantages thereof can be fully understood by referring to the accompanying drawings and explanations thereof with reference to accompanying drawings. In the drawings, the same reference numerals indicate the same elements.

Figure 3:
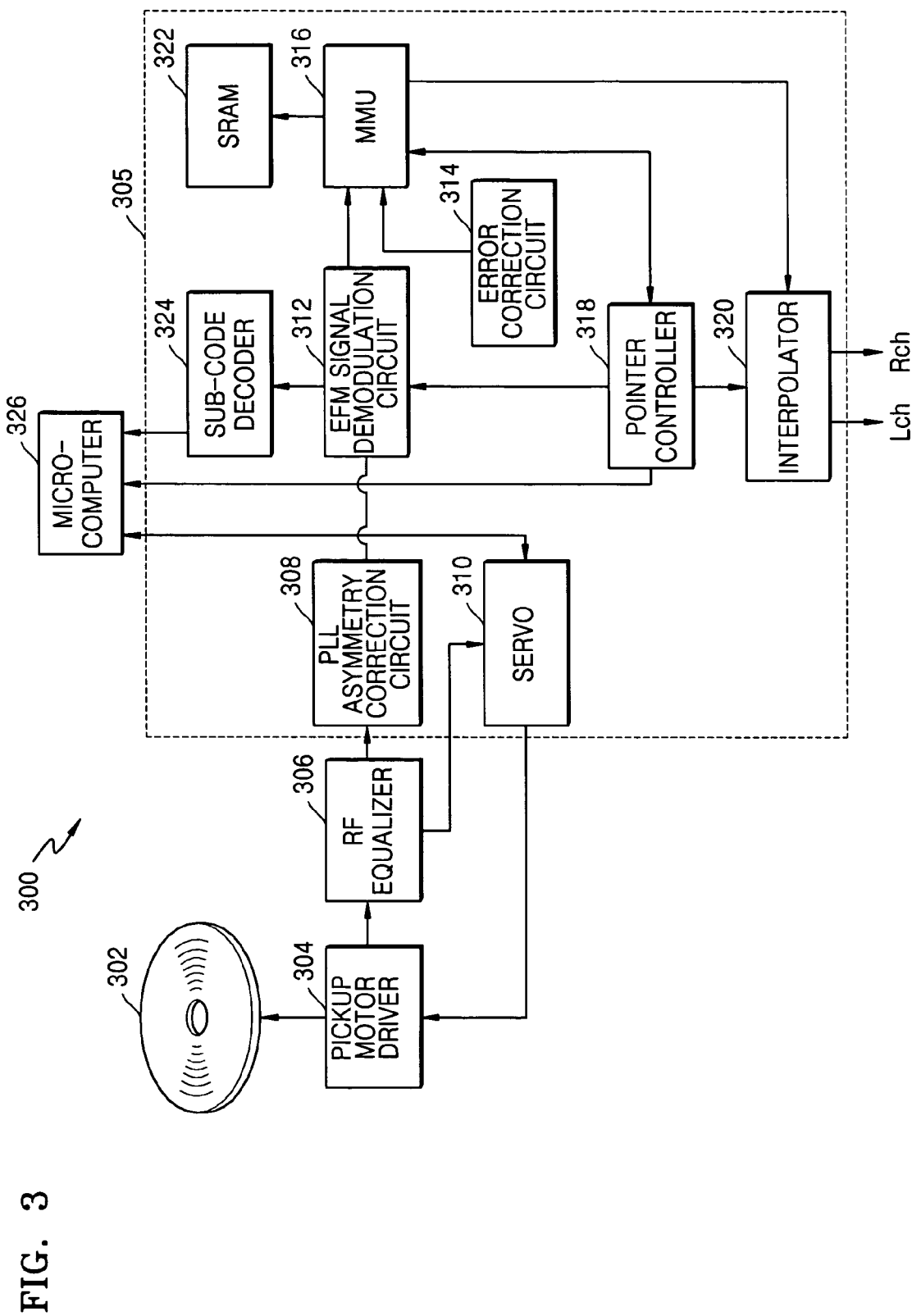
FIG. 3 is a schematic of a CD player according to an exemplary embodiment of the present invention.

FIG. 3 is a schematic of a CD player according to an exemplary embodiment of the present invention. The CD player 300 comprises a disk 302, a pickup motor drive 304, an RF equalizer 306, a PLL asymmetry correction circuit 308, a servo signal processing unit 310, an eight-to-fourteen modulation (EFM) signal demodulation circuit 312, an error correction circuit 314, an memory management unit (MMU) 316, a pointer controller 318, an interpolator 320, an SRAM 322, a sub-code decoder 324, and a microcomputer 326. The PLL asymmetry correction circuit 308, the servo signal processing unit 310, the EFM signal demodulation circuit 312, the error correction circuit 314, the MMU 316, the pointer controller 318, the interpolator 320, the SRAM 322, and the sub-code decoder 324 constitutes a DSP circuit 305.

The disk 302 is rotated by the pickup motor drive 304. The recorded information of the disk 302 is subjected to a waveform-shaping process in the RF equalizer circuit 306, and then, the data is processed in a DSP circuit 305. The PLL asymmetry correction circuit 308 in the DSP circuit 305 corrects a deviation of the RF signal center from the amplitude center.

In addition to the data recorded in each data block on the disk 302, other information on each data block is stored in the disk 302. The other information is referred to as sub-code data, which may include locations of the recorded data on a disk. For example, in the case of an audio disk, the sub-code data contains information on each piece of music on the disk, wherein the information of a currently-reproduced audio signal can be displayed to a user.

The sub-code data is recorded in lead-in, lead-out, and data areas (or user's area). The sub-code data recorded in the lead-in area is table-of-contents (TOC) data, which includes starting time information on all the data recorded on the disk. The sub-code data recorded in the lead-out area includes information on the physical end position of the disk.

The sub-code data recorded in the data area includes information on the currently-reproduced position on the data block and the progress status. For example, a relative address and an absolute address are stored. The relative address includes information on reproducing time (or progressing time) of the music titles corresponding to the data recorded on the sectors. The absolute address includes information related to another type of reproducing time (or an accumulative time),which pertains to a position on the disk where the currently-reproduced data is located. Therefore, the user can check the progress status of the currently-reproduced data by means of the sub-code data recorded in the data area.

The EFM signal demodulation circuit 312 demodulates the EFM signal, the PCM data, the sub-code synchronization signal SCOR, and the sub-code data signal. The demodulated sub-code data signal is sent through a sub-code decoder 324 to a microcomputer 326, which has overall control over the system. In particular, Q channel data of the sub-code data signal is sent to the microcomputer 326. The microprocessor 326 detects the sound discontinuity involved in track jumping, which may be an external impact causing vibration, and performs a sound continuity process. The error correction circuit 314 performs an error correction based on an error correction/detection parity of the PCM data.

The sub-code data signal demodulated in the EFM signal demodulation circuit 312 is sent to the pointer controller 318, and pointers are allocated to respective frames.

Figure 4:
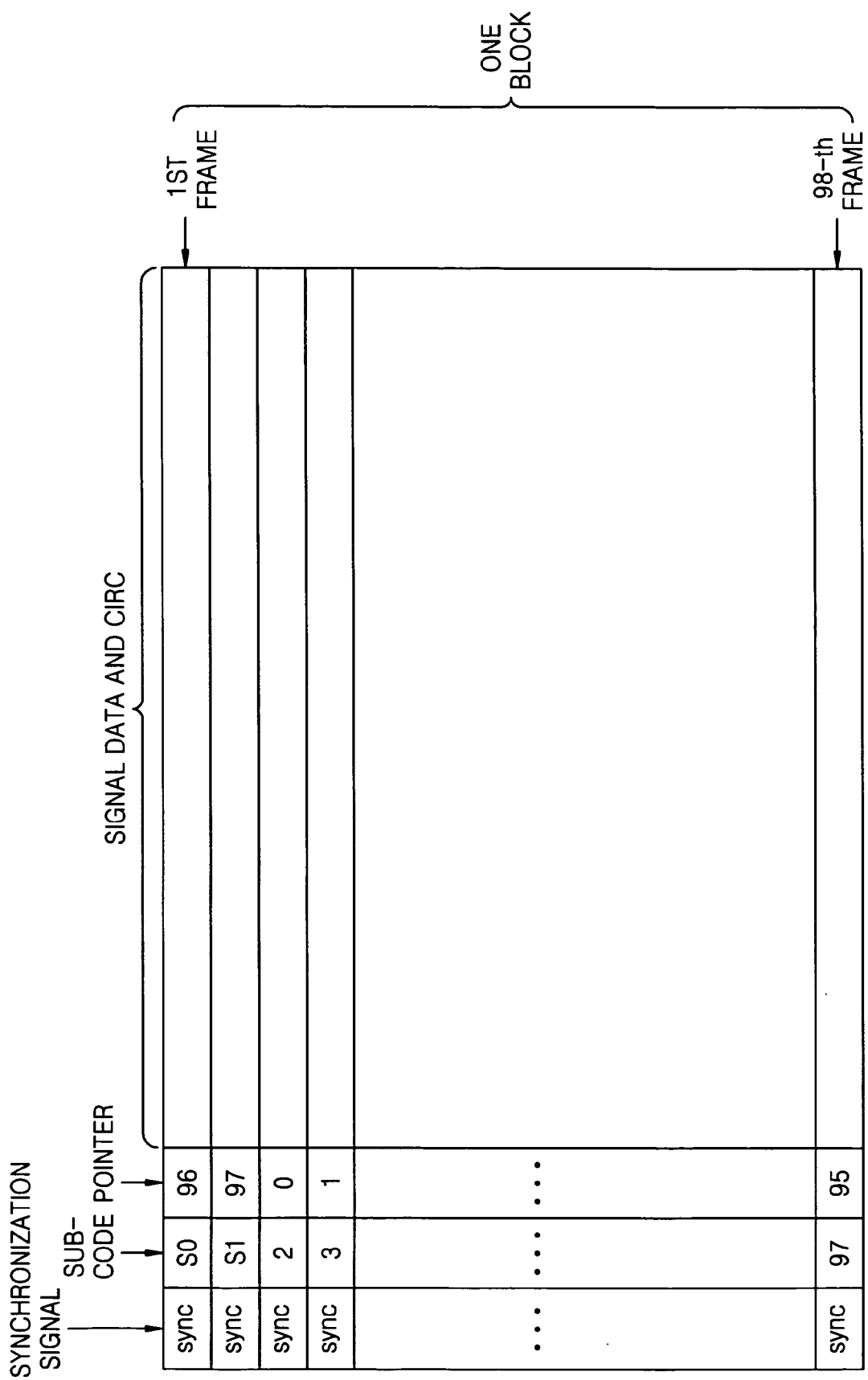
FIG. 4 illustrates a frame structure in a CD data block according to an exemplary embodiment of the present invention.

FIG. 4 illustrates a frame structure in a CD data block in accordance with an exemplary embodiment of the present invention. More specifically, FIG. 4 illustrates a frame structure in a CD data block in accordance with operations of the pointer controller 318. Referring to FIG. 4,one CD data block comprises 98 frames. Each frame comprises a synchronization signal, a sub-code, signal data, and a CIRC (cross interleave Reed-Solomon code). As described above, one pointer is allocated to every frame by the pointer controller 318. In an exemplary allocation scheme, the allocation of pointers starts from a next frame after frames having sub-code synchronization signals S0 and S1. The sub-code synchronization signals S0 and S1 are special signals that are known in the art to delineate the start of a sub-code block. The allocation of the pointers is sequentially performed in such a manner that the sub-code signals S0, S1, 2, 3, . . . , 97 correspond to the pointers 96, 97, 0, 1, . . . , 95.

The MMU 316 controls the operation of writing the data in the SRAM 322. The data of the CD data block that is processed by the EFM signal demodulation circuit 312, the error correction circuit 314, and the pointer controller 318 is stored in the SRAM 322. The interpolator 320 converts the digital signal stored in the SRAM 322 to an analog signal and outputs the analog signal through left and right channels Lch and Rch, respectively.

Figure 2:
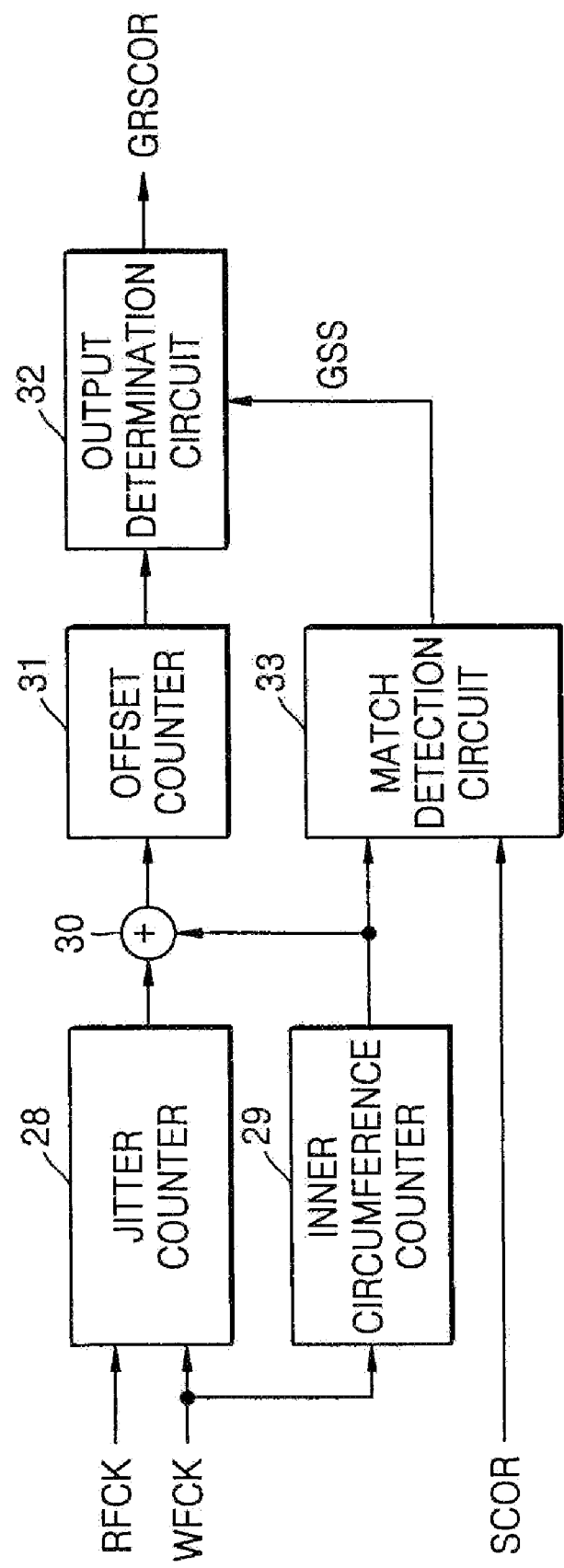
FIG. 2 is a flow diagram illustrating a sub-code synchronization signal generation circuit of the conventional CD player of FIG. 1.

According to exemplary embodiments of the present invention, since pointers are allocated to respective frames, and the allocated pointers and the frame data are stored in an SRAM, the complex hardware construction of a conventional disk player, as shown in FIGS. 1 and 2, is unnecessary.

Furthermore, since the pointers are able to be retrieved even in a jitter environment causing vibration, the sound continuity can be maintained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A disk player comprising:
   a pointer controller that allocates pointers to frames of recorded data read from a disk, wherein the allocation of the pointers starts from a first frame following frames having first sub-code synchronization signals and is performed in a predetermined order;
   a memory, which stores the frames and the allocated pointers; and
   a memory controller, which controls data access operations of the memory.

2. The disk player according to claim 1, wherein the memory is an SRAM which stores the allocated pointers and the frame data mapped to the allocated pointers.

3. The disk player of claim 1, wherein the first sub-code synchronization signals indicate the start of a sub-code block.

4. The disk player according to claim 1, wherein the pointer controller comprises a counter which sequentially allocates pointers to 98 frames in one data block.

5. The disk player according to claim 4, wherein the pointer controller comprises a register which stores the pointers.

6. A disk player comprising:
   a PLL asymmetry correction circuit, which receives recorded data of a disk, wherein the recorded data are RIF signals which are waveform-shaped by an RF equalizer under control of a servo;

an EFM signal demodulation circuit, which demodulates PCM data, a sub-code synchronization signal SCOR, and a sub-code data signal, which are outputs of the PLL asymmetry correction circuit;

a microcomputer, which receives a demodulated sub-code data signal through a sub-code decoder, wherein the sub-code decoder decodes the modulated sub-code data signal;

an error correction circuit, which corrects errors based on an error correction/detection parity of the PCM data;

a pointer controller, which allocates pointers to frames, wherein the allocation of the pointers starts from a first frame following frames having first sub-code synchronization signals and is performed in a predetermined order; a memory, which stores the frames and the allocated pointers;

a memory controller, which controls data access operations of the memory; and an interpolator, which converts digital signals stored in the memory to analog signals and outputs the analog signals through left and right channels.

7. The disk player according to claim 6, wherein the PLL asymmetry correction circuit corrects deviation of the center of the RF signal from a center of amplitude of a vibration.

8. The disk player according to claim 6, wherein the pointer controller comprises a counter which sequentially allocates the pointers to 98 frames in one data block.

9. The disk player according to claim 6, wherein the pointer controller, comprises a register which stores the pointers.

10. The disk player according to claim 6, wherein the memory is an SRAM which stores the allocated pointers and the frame data mapped to the allocated pointers.

11. The disk player of claim 6, wherein the first sub-code synchronization signals indicate the start of a sub-code block.

12. A method of processing a reproduced data in a disk player, the method comprising the steps of:

reading recorded data on a disk, wherein the disk is rotated;

detecting sub-code synchronization signals from frames of the read recorded data;

allocating pointers to the frames, wherein the allocation of the pointers starts from a first frame following frames having first sub-code synchronization signals and is performed in a predetermined order; storing the frames and the pointers corresponding to the frames; and reading the pointer stored in the memory and updating a time.

13. The method according to claim 12, wherein the step of allocating the pointers to the frames is a step of sequentially allocating pointers to 98 frames in one data block.

14. The disk player of claim 12, wherein the first sub-code synchronization signals indicate the start of a sub-code block.

15. A method of processing a reproduced data in a disk player, the method comprising the steps of:

receiving recorded data of a disk, wherein the recorded data are RF signals which are waveform-shaped by an RF equalizer under control of a servo;

correcting of the center of the RF signal from a center of amplitude of a vibration;

demodulating PCM data, a sub-code synchronization signal, and a sub-code data signal by demodulating the corrected RF signal;

decoding the demodulated sub-code data signal and transmitting the decoded demodulated sub-code data signal to a microcomputer;

correcting an error based on an error correction/detection parity of the PCM data;

allocating pointers to frames, wherein the allocation of the pointers starts from a first frame following frames having first sub-code synchronization signals and is performed in a predetermined order;

storing the frames and the allocated pointers;

reading the allocated pointers stored in the memory and updating a time; and converting digital signals stored in the memory to analog signals and outputting the analog signals through left and right channels.

16. The disk player of claim 15, wherein the first sub-code synchronization signals indicate the start of a sub-code block.

* * * * *